US009946044B1

(12) United States Patent
Gralewski-Sek et al.

(10) Patent No.: US 9,946,044 B1
(45) Date of Patent: Apr. 17, 2018

(54) EQUIPMENT CABINET WITH MOVABLE STILE

(71) Applicant: CCS Technology, Inc., Wilmington, DE (US)

(72) Inventors: Grzegorz Konrad Gralewski-Sek, Lodz (PL); Michal Ruda, Lodz (PL)

(73) Assignee: CCS Technology, INC., Wilmington, DE (US)

(*) Notice: Subject to any disclaimer, the term of this patent is extended or adjusted under 35 U.S.C. 154(b) by 0 days.

(21) Appl. No.: 15/421,887

(22) Filed: Feb. 1, 2017

Related U.S. Application Data

(60) Provisional application No. 62/435,273, filed on Dec. 16, 2016.

(51) Int. Cl.
*G02B 6/00* (2006.01)
*H05K 5/00* (2006.01)
*G02B 6/44* (2006.01)
*H04Q 1/02* (2006.01)

(52) U.S. Cl.
CPC ......... *G02B 6/4439* (2013.01); *G02B 6/4452* (2013.01); *H04Q 1/026* (2013.01)

(58) Field of Classification Search
CPC .... G02B 6/4439; G02B 6/444; G02B 6/4452; G02B 6/4441; G02B 6/4446; G02B 6/4455; H04Q 1/025; H04Q 1/026; H04Q 1/14
USPC ................ 385/134, 135; 361/641, 724–726
See application file for complete search history.

(56) References Cited

U.S. PATENT DOCUMENTS

| | | | |
|---|---|---|---|
| 2,445,470 A | 7/1948 | Brauer | |
| 2,535,278 A | 12/1950 | Fletcher | |
| 6,396,990 B1* | 5/2002 | Ehn ...................... | G02B 6/4452 174/50.51 |
| 6,591,053 B2 | 7/2003 | Fritz | |
| 6,603,660 B1* | 8/2003 | Ehn ......................... | H04Q 1/14 174/16.1 |
| 9,095,045 B2 | 7/2015 | Rojo et al. | |
| 2008/0031585 A1* | 2/2008 | Solheid ............... | G02B 6/4452 385/135 |
| 2008/0079341 A1* | 4/2008 | Anderson ............ | G02B 6/4452 312/287 |
| 2009/0110359 A1* | 4/2009 | Smith .................. | G02B 6/4452 385/135 |
| 2009/0307983 A1* | 12/2009 | Nelson ..................... | H04Q 1/10 49/479.1 |

(Continued)

*Primary Examiner* — Robert Tavlykaev
(74) *Attorney, Agent, or Firm* — Brad C. Rametta

(57) ABSTRACT

An equipment cabinet with a movable stile is disclosed herein. In an exemplary embodiment, the equipment cabinet comprises a housing body defining a front opening, independently operable first and second doors, and a movable stile positioned within the front opening and between the first and second doors. First and second sealing pads are positioned between the movable stile and the housing body when the movable stile is in a closed position. First and second sealing gaskets, respectively, are attached to interiors of the first and second doors, where at least a portion of each of the first and second sealing gaskets are positioned between the movable stile and the first or second doors when the first and second doors are closed. Thus, the equipment cabinet has independently operable doors and facilitates increased access to an interior of the equipment cabinet while maintaining an environmental seal.

22 Claims, 12 Drawing Sheets

(56) References Cited

U.S. PATENT DOCUMENTS

2010/0027196 A1\* 2/2010 Schell ................... H02B 1/21
  361/611
2015/0093092 A1 4/2015 Smith et al.

\* cited by examiner

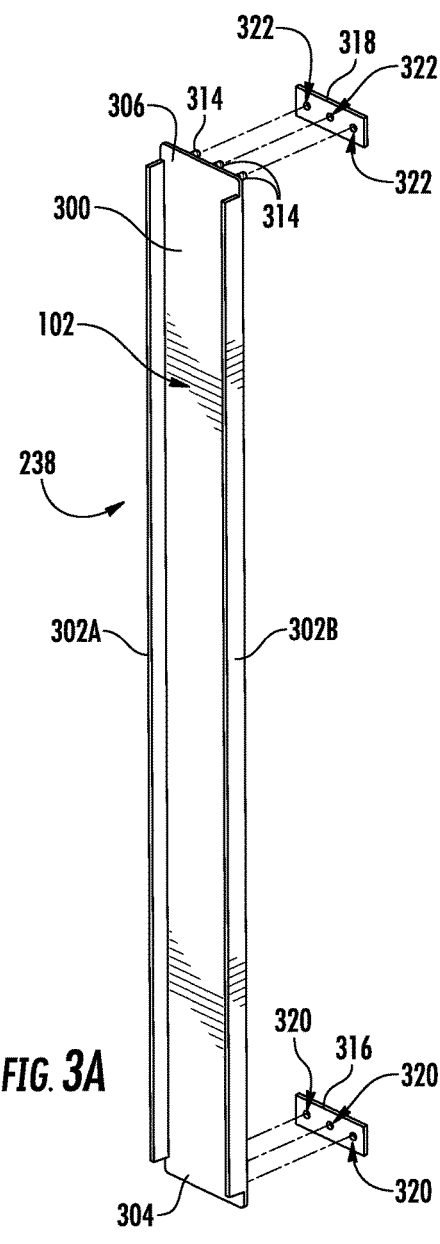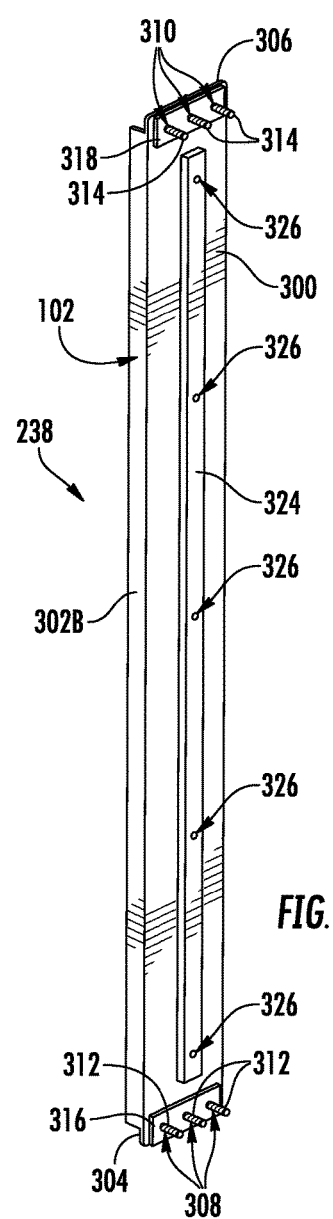
FIG. 3A
FIG. 3B

EQUIPMENT CABINET WITH MOVABLE STILE

PRIORITY APPLICATION

This application claims the benefit of priority to U.S. Provisional Patent Application Ser. No. 62/435,273 filed on Dec. 16, 2016, the content of which is relied upon and incorporated herein by reference in its entirety.

BACKGROUND

Equipment cabinets are used for a variety of purposes. One such purpose is to house fiber optic equipment used as part of a fiber optic network. Such fiber optic equipment may include fiber optic racks, fiber optic patch panels, fiber optic trays, fiber optic cables, etc. These equipment cabinets may be set up indoors, outdoors (e.g., street cabinet), or underground, depending on the needs and services required. Some equipment cabinets have a one door construction and others have a multiple door construction (e.g., two door construction).

An equipment cabinet with independently operable doors may be needed for a variety of reasons, such as for security reasons. For example, it may be desirable to provide a first team with access to a first door and a corresponding first interior area of the equipment cabinet, and provide a second team with access to a second door and a corresponding second interior area of the equipment cabinet. Some equipment cabinets require minimum enclosure sealing capabilities to adequately protect the equipment (e.g., fiber optic equipment) housed within the equipment cabinet from environmental hazards or contamination. For example, one metric of enclosure sealing capabilities is the Ingress Protection (IP) ratings (also known as the International Protection ratings), which define different levels of sealing effectiveness against intrusion from foreign bodies (e.g., dirt, dust, water, etc.). The IP ratings are published by the International Electrotechnical Commission (IEC), which is an international standards organization that prepares and publishes international standards for electrical, electronic, and related technologies. In particular, the IP ratings indicate the level of protection for solids (the first digit) and liquids (the second digit). For solids, the IP ratings include the following levels indicating the object size protected against: Level 0 (not protected), Level 1 (>50 mm), Level 2 (>12.5 mm), Level 3 (>2.5 mm), Level 4 (>1 mm), Level 5 (dust protected), and Level 6 (dust tight). For liquids, the IP ratings include the following levels indicating the object size protected against: Level 0 (not protected), Level 1 (dripping water), Level 2 (dripping water when tilted up to 15°), Level 3 (spraying water), Level 4 (splashing water), Level 5 (water jets), Level 6 (powerful water jets), Level 7 (immersion up to 1 m), and Level 8 (immersion beyond 1 m).

To provide independently operable doors and minimum enclosure sealing capabilities, equipment cabinets may include a face frame with at least a portion of the face frame positioned within part of an opening, but such a configuration may be cumbersome and limiting. For example, such a configuration may require an operator to work around the face frame, which may be even more difficult if the operator is trying to access something directly and immediately behind the face frame, such as for installation, servicing, maintenance, etc. Thus, such a configuration may limit the mounting design of equipment within the equipment cabinet to ensure easy access, potentially forcing a suboptimal design.

As a result, there is a need for an equipment cabinet with independently operable doors that facilitates increased access to an interior of the equipment cabinet while maintaining an environmental seal.

No admission is made that any reference cited herein constitutes prior art. Applicant expressly reserves the right to challenge the accuracy and pertinency of any cited documents.

SUMMARY

This disclosure relates generally to an equipment cabinet with a movable stile, and in particular, to an equipment cabinet with independently operable doors configured to open and close and a movable center stile configured to facilitate selective access to an area of the equipment cabinet behind the movable center stile.

A stile, as used herein, is a vertical piece (e.g., vertical panel, vertical bar, etc.) of a face frame of a cabinet. In an exemplary embodiment, the equipment cabinet comprises a housing body defining a front opening, independently operable first and second doors, and a movable stile (e.g., movable center stile) positioned within the front opening and between the first and second doors. The movable stile provides structural support and a surface (e.g., sealing surface) for each of at least two doors (e.g., the first and second doors) to contact and engage the movable stile in order to secure and enclose an interior of the cabinet when the at least two doors are closed. The movable stile is selectively movable between a closed position and an open position, for example by being removably attached to the housing body, which facilitates increased access to an interior of the equipment cabinet. Further, the equipment cabinet includes an environmental seal to protect the equipment (e.g., fiber optic equipment) housed within the equipment cabinet. In particular, first (e.g., top) and second (e.g., bottom) sealing pads are positioned between the movable stile and the housing body when the movable stile is in the closed position. Further, first and second sealing gaskets, respectively, are attached to interiors of the first and second doors, where at least a portion of each of the first and second sealing gaskets are positioned between the movable stile and one of the first and second doors when the first and second doors are closed. Thus, the equipment cabinet has independently operable doors and facilitates increased access to an interior of the equipment cabinet while maintaining an environmental seal.

One embodiment of the disclosure relates to an equipment cabinet, comprising a housing body defining a front opening, a first door attached to a first side of the housing body, a second door attached to a second side of the housing body opposite the first side, a stile movably attached to the housing body, and a first sealing pad. The first door is movable to selectively enclose a first portion of the front opening. The second door is movable to selectively enclose a second portion of the front opening. The first and second doors are each independently movable between a closed position and an open position. The stile is movable to selectively enclose a third portion of the front opening between the first and second portions of the front opening. At least a portion of the first door overlaps with at least a first portion of the stile when the first door is in the closed position. At least a portion of the second door overlaps with at least a second portion of the stile when the second door is in the closed position. The first sealing pad is positioned between the stile and the housing body when the stile encloses the third portion.

An additional embodiment of the disclosure relates to an equipment cabinet comprising a housing body defining a front opening, a first door attached to a first side of the housing body, a second door attached to a second side of the housing body opposite the first side, a stile movably attached to the housing body, a first sealing gasket fixedly attached to an interior of the first door, and a second sealing gasket fixedly attached to an interior of the second door. The first door is movable to selectively enclose a first portion of the front opening. The second door is movable to selectively enclose a second portion of the front opening. The first and second doors are each independently movable between a closed position and an open position. The stile is movable to selectively enclose a third portion of the front opening between the first and second portions of the front opening. At least a portion of the first door overlaps with at least a first portion of the stile when the first door is in the closed position. At least a portion of the second door overlaps with at least a second portion of the stile when the second door is in the closed position. At least a portion of the first sealing gasket is positioned between the first door and the stile when the first door is in the closed position. At least a portion of the second sealing gasket is positioned between the second door and the stile when the second door is in the closed position.

An additional embodiment of the disclosure relates to a method of using an equipment cabinet. The method comprises opening a first door attached to a first side of a housing body to reveal a first portion of a front opening of the housing body. The method further comprises opening a second door attached to a second side of the housing body opposite the first side to reveal a second portion of the front opening of the housing body. The first and second doors are each independently movable between a closed position and an open position. The method further comprises opening a stile extending across the front opening to reveal a third portion of the front opening of the housing body. The third portion is positioned between the first and second portions of the front opening. The method further comprises closing the stile to enclose the third portion of the front opening. A first sealing pad is positioned between the stile and the housing body when the stile is closed. The method further comprises closing the first door to enclose the first portion of the front opening. At least a portion of the first door overlaps with at least a first portion of the stile. The method further comprises closing the second door to enclose the second portion of the front opening. At least a portion of the second door overlaps with at least a second portion of the stile.

An additional embodiment of the disclosure relates to a method of using an equipment cabinet. The method comprises opening a first door attached to a first side of a housing body to reveal a first portion of a front opening of the housing body. The method further comprises opening a second door attached to a second side of the housing body opposite the first side to reveal a second portion of the front opening of the housing body. The first and second doors are each independently movable between a closed position and an open position. The method further comprises opening a stile extending across the front opening to reveal a third portion of the front opening of the housing body. The third portion is positioned between the first and second portions of the front opening. The method further comprises closing the stile to enclose the third portion of the front opening. The method further comprises closing the first door to enclose the first portion of the front opening. At least a portion of the first door overlaps with at least a first portion of the stile. At least a portion of a first sealing gasket is positioned between the first door and the stile. The first sealing gasket is fixedly attached to an interior of the first door. The method further comprises closing the second door to enclose the second portion of the front opening. At least a portion of the second door overlaps with at least a second portion of the stile. At least a portion of a second sealing gasket is positioned between the second door and the stile. The second sealing gasket is fixedly attached to an interior of the second door.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 3A is a front perspective view of a movable stile subassembly as shown in FIGS. 1-2B;

FIG. 3B is a back perspective view of the movable stile subassembly of FIG. 3A;

DETAILED DESCRIPTION

Figure 1:
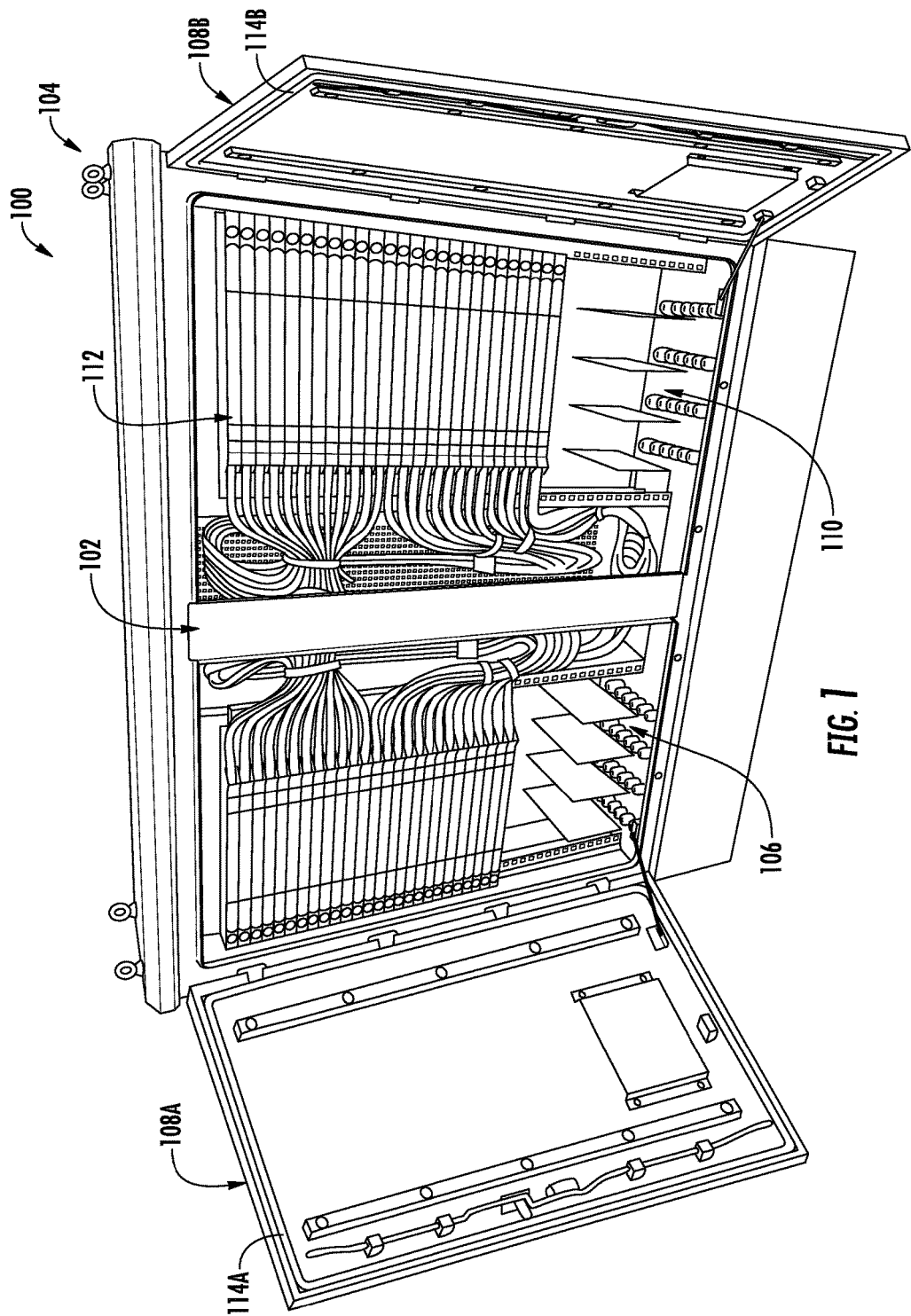
FIG. 1 is a perspective view of an exemplary equipment cabinet including a movable stile attached to the equipment cabinet in a closed position and including fiber optic equipment mounted within the equipment cabinet.

Embodiments of the disclosure are directed to an equipment cabinet with a movable stile. A stile, as used herein, is a vertical piece (e.g., vertical panel, vertical bar, etc.) of a face frame of a cabinet. In an exemplary embodiment, the equipment cabinet comprises a housing body defining a front opening, independently operable first and second doors, and a movable stile (e.g., movable center stile) positioned within the front opening and between the first and second doors. The movable stile provides structural support and a surface (e.g., sealing surface) for each of at least two doors (e.g., the first and second doors) to contact and engage the movable stile in order to secure and enclose an interior of the cabinet when the at least two doors are closed. The movable stile is selectively movable between a closed position and an open position, for example by being removably attached to the housing body, which facilitates increased access to an interior of the equipment cabinet. Further, the equipment cabinet includes an environmental seal to protect the equipment (e.g., fiber optic equipment) housed within the equipment cabinet. In particular, first (e.g., top) and second (e.g., bottom) sealing pads are positioned between the movable stile and the housing body when the movable stile is in the closed position. Further, first and second sealing gaskets, respectively, are attached to interiors of the first and second doors, where at least a portion of each of the first and second sealing gaskets are positioned between the movable stile and one of the first and second doors when the first and second doors are closed. Thus, the equipment cabinet has independently operable doors and facilitates increased access to an interior of the equipment cabinet while maintaining an environmental seal.

Reference is now made in detail to exemplary embodiments of the disclosure, examples of which are illustrated in the accompanying drawings. Whenever possible, the same or similar reference numerals are used throughout the drawings to refer to the same or similar parts. It should be understood that the embodiments disclosed herein are merely examples, each incorporating certain benefits of the present disclosure. Various modifications and alterations may be made to the following examples within the scope of the present invention, and aspects of the different examples may be mixed in different ways to achieve yet further examples. Accordingly, the true scope of the invention is to be understood from the entirety of the present disclosure, in view of but not limited to the embodiments described herein.

FIG. 1 is a perspective view of an exemplary equipment cabinet 100 (e.g., fiber optic equipment cabinet) with a movable center stile 102. In an exemplary embodiment, the equipment cabinet 100 comprises a housing body 104 defining a front opening 106, independently operable left and right doors 108A (e.g., first and second doors), 108B, and the movable center stile 102 (e.g., movable stile) is positioned within the front opening 106 and between the left and right doors 108A, 108B. The movable center stile 102 provides structural support and a surface (e.g., sealing surface) for each of at least two doors (e.g., left and right doors 108A, 108B) to contact and engage the movable center stile 102 in order to secure and enclose an interior 110 of the equipment cabinet 100 when the doors (e.g., left and right doors 108A, 108B) are closed. The movable center stile 102 is selectively movable between a closed position and an open position, for example by being movably (e.g., removably) attached to the housing body 104, which facilitates increased access to the interior 110 of the equipment cabinet 100. Further, the equipment cabinet 100 includes an environmental seal to protect the equipment (e.g., fiber optic equipment 112) housed within the equipment cabinet 100. In particular, first (e.g., top) and second (e.g., bottom) sealing pads (not shown in FIG. 1) are positioned between the movable center stile 102 and the housing body 104 when the movable center stile 102 is in a closed position. Further, left and right sealing gaskets 114A, 114B (e.g., first and second sealing gaskets), respectively, are attached to interiors of the left and right doors 108A, 108B, where at least a portion of each of the left and right sealing gaskets 114A, 114B are positioned between the movable center stile 102 and one of the left and right doors 108A, 108B when the left and right doors 108A, 108B are closed. Thus, the equipment cabinet 100 has independently operable doors 108A, 108B and facilitates increased access to the interior 110 of the equipment cabinet 100 while maintaining an environmental seal.

Figure 2A:
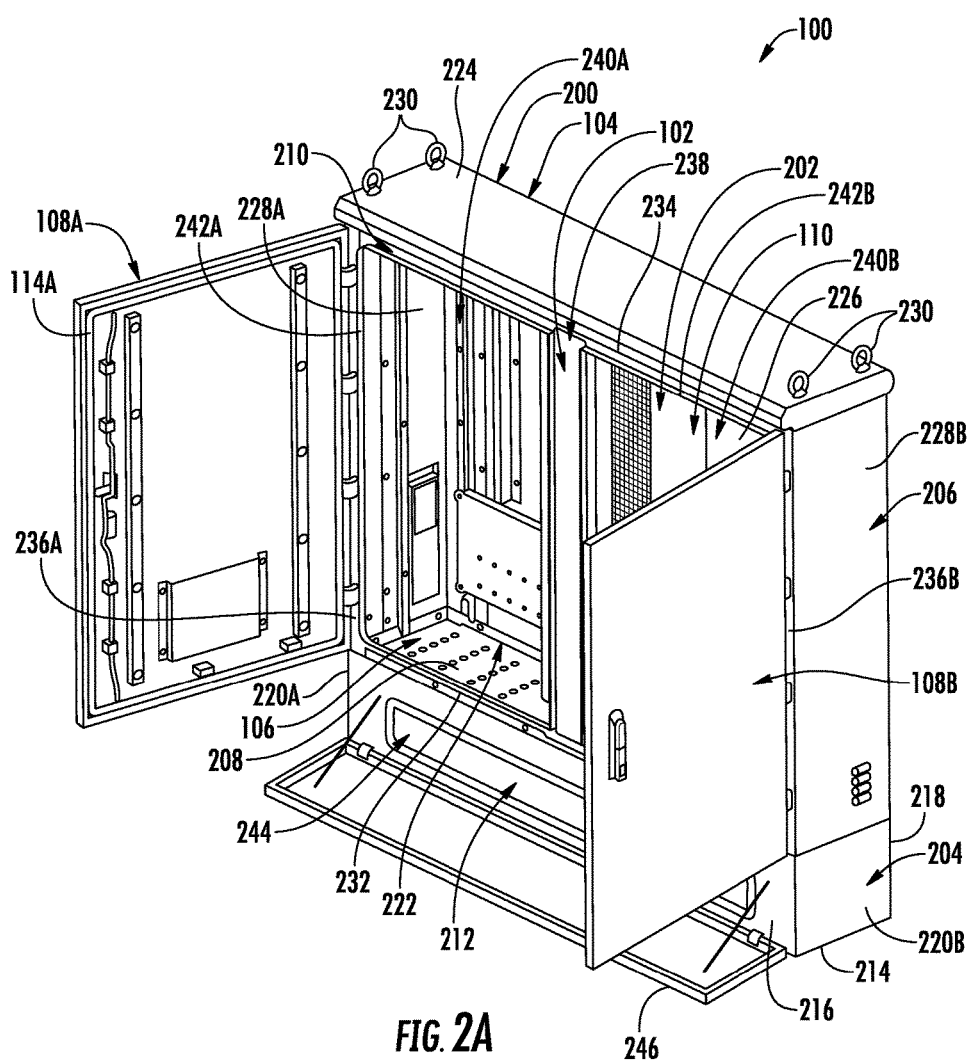
FIG. 2A is a perspective view of the exemplary equipment cabinet of FIG. 1 with the movable stile in a closed position.
Figure 2B:
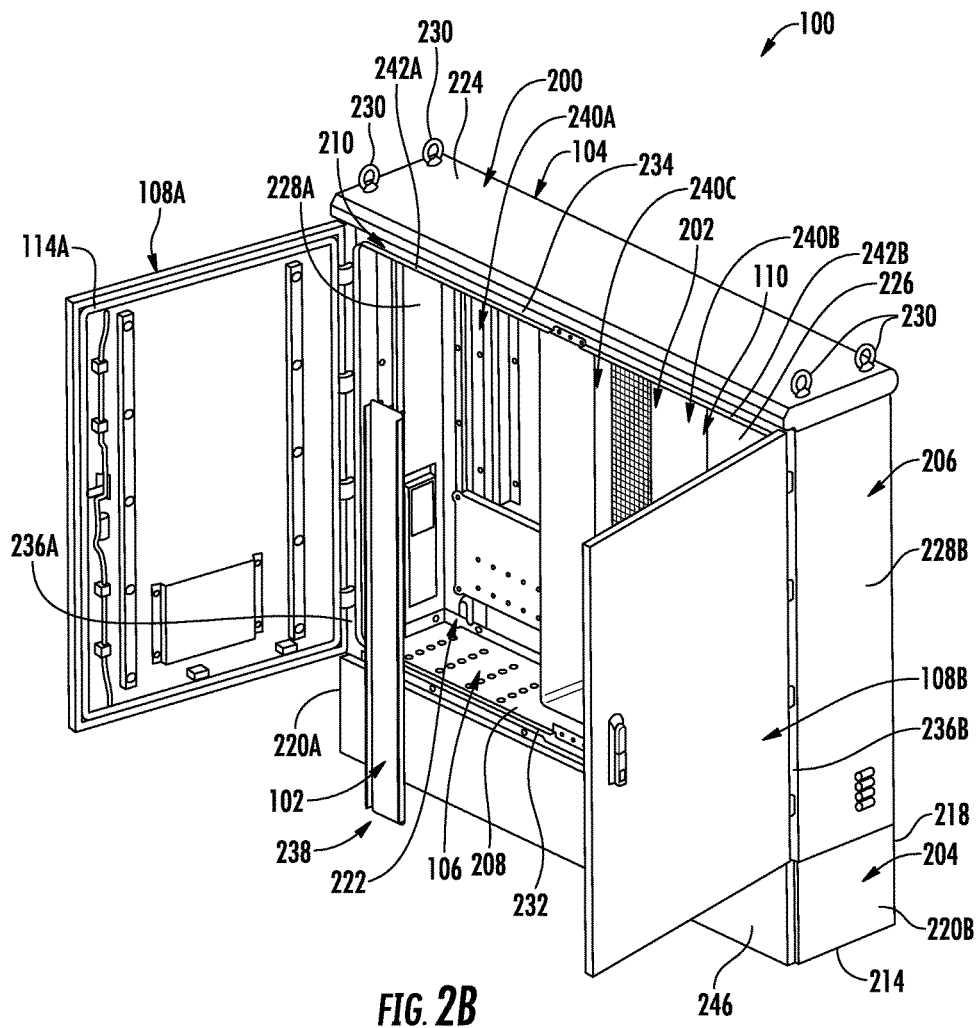
FIG. 2B is a perspective view of the exemplary equipment cabinet of FIGS. 1 and 2A with the movable stile in an open position.

FIGS. 2A and 2B are views of the exemplary equipment cabinet 100 of FIG. 1 with the movable center stile 102 in a closed position in FIG. 2A and in an open position in FIG. 2B. The equipment cabinet 100 includes a housing 200 and a mounting substructure 202 within the housing 200 for mounting fiber optic equipment 112 within the housing 200. In particular, the housing 200 includes a lower base 204 for storing equipment (e.g., fiber optic equipment 112), an upper shell 206 positioned above the lower base 204 for storing equipment (e.g., fiber optic equipment 112), a horizontal shelf 208 positioned between and separating interiors of the lower base 204 and the upper shell 206, and a cabinet face frame 210 fixedly attached to a front of the upper shell 206 for mounting and securing the left and right doors 108A, 108B (e.g., whether in an open or closed position). Although two doors 108A, 108B are shown, more doors could be used. For example, the left door 108A (e.g., first door) may include an upper door and a lower door and/or the right door 108B (e.g., second door) may include an upper door and a lower door.

The lower base 204 includes a plurality of walls defining a lower interior 212 for housing equipment (e.g., fiber optic equipment 112). In particular, the lower base 204 includes a bottom wall 214 positioned underneath and opposite from the horizontal shelf 208, a front wall 216 upwardly extending from a front edge of the bottom wall 214, a rear wall 218 opposite the front wall 216 and upwardly extending from a back edge of the bottom wall 214, a left sidewall 220A upwardly extending from a left edge of the bottom wall 214, and a right sidewall 220B upwardly extending from a right edge of the bottom wall 214 opposite the left sidewall 220A. The horizontal shelf 208, bottom wall 214, front wall 216, rear wall 218, and left and right sidewalls 220A, 220B define the lower interior 212.

The upper shell 206 includes a plurality of walls defining an upper interior 222 for housing equipment (e.g., fiber optic equipment 112). In particular, the upper shell 206 includes a top wall 224 positioned above and opposite from the horizontal shelf 208, a rear wall 226 downwardly extending from a front edge of the top wall 224 (e.g., coplanar with the lower base 204 rear wall 218), a left sidewall 228A downwardly extending from a left edge of the top wall 224 (e.g., coplanar with the lower base 204 left sidewall 220A), and a right sidewall 228B downwardly extending from a right edge of the top wall 224 (e.g., coplanar with the lower base 204 right sidewall 220B). The horizontal shelf 208, top wall 224, rear wall 226, and left and right sidewalls 228A, 228B at least partially define the upper interior 222.

One or more eye bolts 230 may be attached to and extend upwardly from the top wall 224. The one or more eye bolts 230 provide an engagement point for lifting and moving the equipment cabinet 100, such as for installing and/or transporting the equipment cabinet 100.

The cabinet face frame 210 is attached to (e.g., integrally extending from) front edges of the lower base 204 and/or upper shell 206. In certain embodiments, as shown in FIGS. 2A and 2B, the cabinet face frame 210 is integrally attached to the top wall 224, rear wall 226, left and right sidewalls 228A, 228B and/or horizontal shelf 208. The cabinet face frame 210 provides an engagement and/or mounting surface for the left and right doors 108A, 108B to selectively independently lock the left and right doors 108A, 108B to the face frame 210 and/or to provide a surface to form an environmental seal between the left and right doors 108A, 108B and the face frame 210.

The cabinet face frame 210 includes a bottom rail 232 positioned proximate to (e.g., attached to or integrally upwardly extending from) the horizontal shelf 208, a top rail 234 positioned proximate to (e.g., attached to or integrally downwardly extending from) the upper shell 206 top wall 224, a left side stile 236A positioned proximate to (e.g., attached to or integrally inwardly extending from the upper shell 206 left sidewall 228A), a right side stile 236B positioned proximate to (e.g., attached to or integrally inwardly extending from the upper shell 206 right sidewall 228B), and a movable stile subassembly 238 (explained in more detail below). The left and right side stiles 236A, 236B provide surfaces to mount (e.g., pivotally, hingedly, etc.) the left and right doors 108A, 108B and/or to form an environmental seal therebetween. The bottom and top rails 232, 234 provide surfaces to lock the left and right doors 108A, 108B to the face frame 210 and/or form an environmental seal therebetween.

The movable stile subassembly 238 provides increased access to the interior 110 (e.g., the upper interior 222) of the equipment cabinet 100. The movable stile subassembly 238 includes the movable center stile 102 (e.g., movable stile, movable panel, movable bar, movable center panel, movable center bar, movable vertical stile, movable vertical panel, movable vertical bar, etc.) positioned between the left and right side stiles 236A, 236B, and extending between the bottom rail 232 and the top rail 234. The movable center stile 102 provides a surface to lock the left and right doors 108A, 108B to the face frame 210 and/or to form an environmental seal therebetween. Further, the movable center stile 102 is selectively movable (e.g., removable) from the rest of the face frame 210 to provide increased access to the interior 110 of the housing 200. In other words, the movable center stile 102 is not permanently attached (e.g., integrally connected, welded, etc.) to the rest of the face frame 210.

Cabinet face frame 210 bottom rail 232, top rail 234 and left and right side stiles 236A, 236B define the front opening 106. In particular, the front opening 106 includes a left portion 240A defined by the bottom rail 232, top rail 234, and left side stile 236A, a right portion 240B defined by the bottom rail 232, top rail 234, and right side stile 236B, and a middle portion 240C positioned between the left and right portions 240A, 240B and defined by the bottom rail 232 and top rail 234. Further, the cabinet face frame 210 includes a left peripheral flange 242A forwardly extending from a left portion of the bottom rail 232, a left portion of the top rail 234, and an inward peripheral edge of the left side stile 236A around the periphery of the left portion 240A of the front opening 106. Similarly, the cabinet face frame 210 includes a right peripheral flange 242B forwardly extending from a right portion of the bottom rail 232, a right portion of the top rail 234, and an inward peripheral edge of the right side stile 236B around the periphery of the right portion 240B of the front opening 106. The left and right peripheral flanges 242A, 242B provide structural rigidity to the face frame 210. Accordingly, although the left and right peripheral flanges 242A, 242B are shown as forwardly extending, they could be rearwardly extending instead.

The left door 108A is mounted (e.g., hingedly mounted, pivotally mounted, etc.) to the left side stile 236A of the face frame 210 and is selectively movable between a closed position and an open position to selectively cover the left portion 240A of the front opening 106. The right door 108B is mounted (e.g., hingedly mounted, pivotally mounted, etc.) to the right side stile 236B of the face frame 210 and is selectively movable between a closed position and an open position to selectively cover the right portion 240B of the front opening 106. The left and right doors 108A, 108B are independently operable and independently lockable. The movable center stile 102 is movably mounted (e.g., removably mounted) to the bottom rail 232 and/or top rail 234 and is selectively movable between a closed position and an open position to selectively cover the middle portion 240C of the front opening 106. In certain embodiments, the middle portion 240C is continuous and undivided with the left and/or right portions 240A, 240B. In other embodiments, the middle portion 240C is divided from the left and/or right portions 240A, 240B (e.g., by internal walls). In a closed position, the movable center stile 102 may partially define the left portion 240A and/or right portion 240B of the front opening 106. The movable center stile 102 being movably mounted to the bottom rail 232 and/or top rail 234 allows the left and right doors 108A, 108B to be independently operable and lockable. This is preferable in comparison to mounting the movable center stile 102 to one of the left or right doors 108A, 108B, which would then require dependent opening. For example, if the movable center stile 102 was mounted to the left door 108A, then that door would have to be opened last and closed first relative to the right door 108B.

In certain embodiments, the face frame 210 is completely covered by the left and right doors 108A, 108B when the left and right doors 108A, 108B are in the closed position. In other embodiments, the face frame 210 is only partially covered by the left and right doors 108A, 108B when the left and right doors 108A, 108B are in the closed position (e.g., the movable center stile 102 is exposed and visible between the left and right doors 108A, 108B). In some embodiments, the face frame 210 only includes the movable center stile 102 (and does not include bottom rail 232, top rail 234, left side stile 236A, and/or right side stile 236B.

The housing body 104 includes the lower base 204, the upper shell 206, the horizontal shelf 208 and the cabinet face frame 210 except for the movable stile subassembly 238. In this way, the movable center stile 102 is movably attached to the housing body 104. The movable stile subassembly 238 is movable (e.g., removable) relative to the housing body 104 for ease of access to the interior 110 (e.g., upper interior 222) of the equipment cabinet 100. Although the movable center stile 102 is shown as being entirely removable, other configurations could be used. For example, the movable center stile 102 could be pivotally, hingedly, slidably, etc. attached to the bottom rail 232 and/or top rail 234. Further, the movable center stile 102 could have a fixed portion and a movable portion, such as if a bottom portion was fixed, and a top portion was hingedly attached to the top rail 234. Accordingly, the movable center stile 102 may be movable to (e.g., removable from) the housing body 104 (e.g., bottom rail 232 and/or top rail 234 of the cabinet face frame 210)

The lower base 204 defines a lower opening 244 in the front wall 216 of the lower base 204. The equipment cabinet 100 further includes a base door 246 mounted (e.g., hingedly mounted, pivotally mounted) to the lower base 204 and selectively movable between a closed position and an open position to selectively cover the lower opening 244. The lower base 204 could be used to house equipment (e.g., fiber optic equipment 112).

FIGS. 3A and 3B are views of the movable stile subassembly 238 of FIGS. 1-2B. The movable stile subassembly 238 includes the movable center stile 102, which includes a body 300 with a left flange 302A extending along a left edge of the movable center stile body 300 and a right flange 302B extending along a right edge of the movable center stile body 300. The left and right flanges 302A, 302B provide structural rigidity to the movable center stile 102. Thus, although the left and right flanges 302A, 302B are shown as forwardly extending, the left and right flanges 302A, 302B could be rearwardly extending instead.

Further, the movable center stile body 300 includes a bottom mounting panel 304 positioned at a first end (e.g., bottom end) of the body 300 and a top mounting panel 306 positioned at a second end (e.g., top end) of the body 300. The bottom and top mounting panels 304, 306 mount the movable center stile 102 to the housing body 104 (e.g., bottom and top rails 232, 234), as explained in more detail below. The bottom mounting panel 304 defines one or more bottom fastener blind holes 308, and the top mounting panel 306 defines one or more top fastener blind holes 310 to receive (e.g., frictionally engage) one or more fasteners positioned therein to attach the movable center stile 102 to the housing body 104. In particular, the movable stile subassembly 238 includes bottom pin screws 312 positioned within (e.g., frictionally engaged with) the one or more bottom fastener blind holes 308, and top pin screws 314 positioned within (e.g., frictionally engaged with) the one or more top fastener blind holes 310 for attachment of the movable center stile 102 to the housing body 104. The bottom and top fastener blind holes 308, 310 avoid the need for additional components (e.g., o-rings, gaskets, etc.) to create an environmental seal between the bottom and top pin screws 312, 314 and the movable center stile body 300, such as would be needed if through holes were used instead.

The movable stile subassembly 238 further includes a bottom sealing pad 316 (e.g., first sealing pad) and a top sealing pad 318 (e.g., second sealing pad). As explained below, the bottom and top sealing pads 316, 318 provide an environmental seal between the movable center stile 102 and the housing body 104, particularly between the movable center stile 102 bottom and top mounting panels 304, 306 and the bottom and top rails 232, 234 of the face frame 210. The bottom sealing pad 316 may comprise an aperture (e.g., one or more through holes 320) to receive one or more bottom pin screws 312 therethrough, and the top sealing pad 318 may comprise an aperture (e.g., one or more through holes 322) to receive one or more top pin screws 314 therethrough. The bottom and top sealing pads 316, 318 may be made of silicone or any other sealing material. Additionally, the bottom and top sealing pads 316, 318 may be attached, such as by adhesive, to either the back surface of the movable center stile 102 or the front surface of the face frame 210 (e.g., bottom and top rails 232, 234).

In certain embodiments, the movable stile subassembly 238 further includes a stiffening bar 324 attached to a back surface of the movable center stile body 300 to provide greater structural rigidity to the movable center stile 102. The stiffening bar 324 could be used in addition to (or instead of) the left and right flanges 302A, 302B. Additionally, or alternatively, the body 300 could be made thicker. In certain embodiments, to attach the stiffening bar 324 to the movable center stile body 300, the body 300 may include a plurality of blind holes (not shown) in a back surface thereof to receive a plurality of pin screws (not shown) positioned therein (e.g., frictional engaged therewith). In such an embodiment, the stiffening bar 324 includes one or more through holes 326 to receive the plurality of pin screws and a plurality of fasteners (not shown) would thereby secure the stiffening bar 324 to the movable center stile body 300.

Figure 4A:
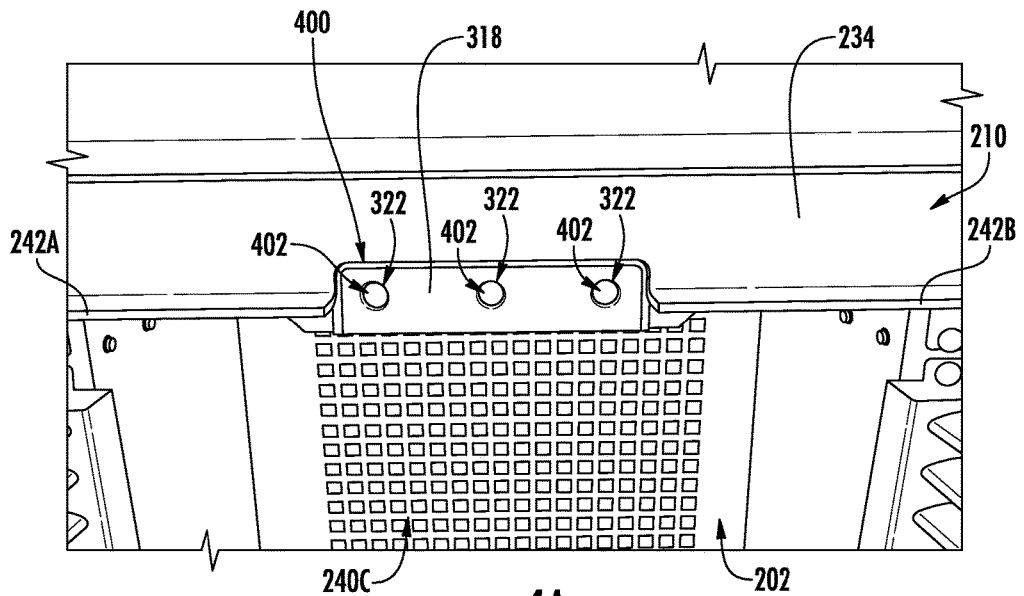
FIG. 4A is a front perspective view of a top mounting panel of a housing body of the equipment cabinet of FIGS. 1-2B for attaching the movable stile subassembly to the equipment cabinet housing body.
Figure 4B:
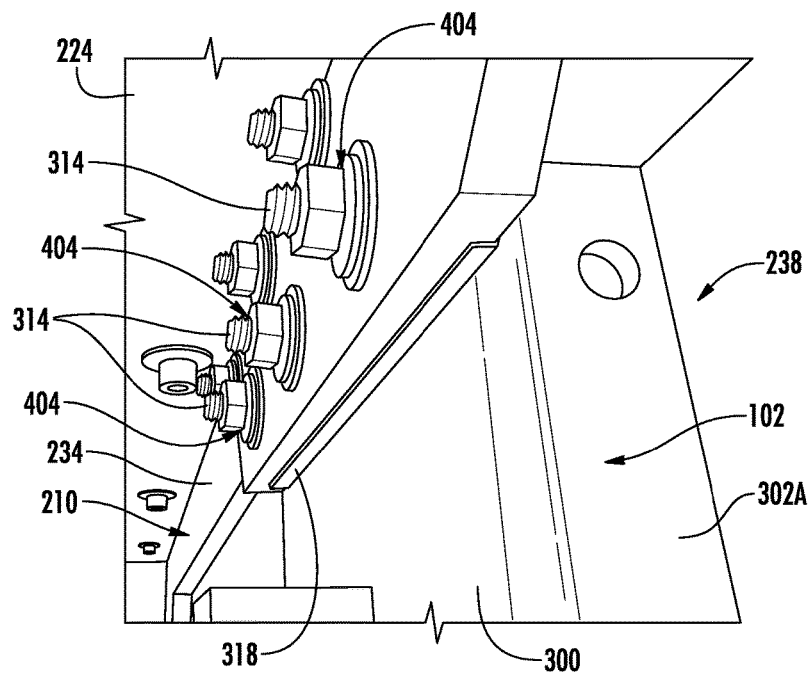
FIG. 4B is a back perspective view of the top mounting panel of FIG. 4A with the movable stile subassembly attached thereto and in a closed position.
Figure 4C:
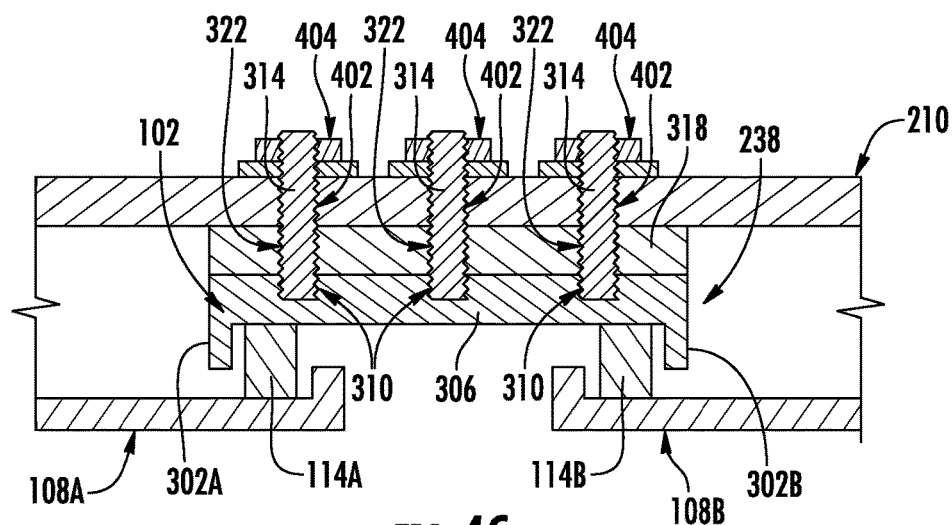
FIG. 4C is a cross-sectional view of the top mounting panel of FIG. 4B.

FIGS. 4A-4C are views illustrating attachment of the movable stile subassembly 238 of FIGS. 1-2B to the housing body 104, and in particular, attachment of the movable center stile 102 top mounting panel 306 to a top recessed mounting panel 400 of the top rail 234. Although FIGS. 4A-4C are directed to the top mounting panel 306 and the top recessed mounting panel 400, the discussion is also applicable to the bottom mounting panel 304 and a bottom recessed mounting panel (discussed in FIG. 5).

Referring to FIG. 4A, the top rail 234 includes the top recessed mounting panel 400 configured to receive the top mounting panel 306 of the movable center stile 102 for attachment of the movable center stile 102 to the housing body 104. The top recessed mounting panel 400 is recessed from a front surface of the top rail 234 so that the movable center stile 102 is approximately flush with the front surface of the top rail 234 when in a closed position. The top recessed mounting panel 400 further includes a plurality of through holes 402 to receive the top pin screws 314 (not shown in FIG. 4A) therethrough for attachment of the movable center stile 102 to the housing body 104.

Referring to FIGS. 4B and 4C, when the movable center stile 102 is in the closed position, the top sealing pad 318 is positioned between movable center stile 102 and the top mounting panel 306. In particular, the top pin screws 314 are positioned through the top sealing pad 318 via through holes 322 and the top recessed mounting panel 400 through holes 402, such that at least a portion of the top pin screws 314 extend past an interior surface of the top recessed mounting panel 400. The movable stile subassembly 238 further includes one or more stile attachment fasteners 404 (e.g., washers, nuts, etc.) to engage the protruding portion of the top pin screws 314, thereby securing the movable center stile 102 to the top rail 234 top recessed mounting panel 400. An environmental seal is created between the movable center stile 102 (e.g., the top mounting panel 306) and the top rail 234 (e.g., top recessed mounting panel 400) by the top sealing pad 318 positioned therebetween (where the movable center stile 102 does not overlap with either of the left or right doors 108A, 108B).

Further, when the movable center stile 102 and left and right doors 108A, 108B are in a closed position, a left portion of the movable center stile 102 overlaps with a right portion of the left door 108A (with a portion of the left sealing gasket 114A positioned in between), and a right portion of the movable center stile 102 overlaps with a left portion of the right door 108B (with a portion of the right sealing gasket 114B positioned in between). The left and right sealing gaskets 114A, 114B may be made of rubber and/or have a wide range of elasticity to form a tight seal. Accordingly, an environmental seal is created between the movable center stile 102 and the left door 108A by the left sealing gasket 114A, and an environmental seal is created between the movable center stile 102 and the right door 108B by the right sealing gasket 114B (as discussed in more detail below).

The environmental seal created may meet any desired sealing requirements, such as those of the Ingress Protection (IP) ratings (also known as the International Protection ratings), which define different levels of sealing effectiveness against intrusion from foreign bodies (e.g., dirt, dust, water, etc.). In particular, the equipment cabinet 100 can achieve a rating of IP 65 (e.g., protected from total dust ingress and protected from low pressure water jets from any direction, limited ingress protection) and/or a rating of IP 68 (e.g., protected from total dust ingress and protected from long term immersion up to a specified pressure, limited ingress protection). Accordingly, the equipment cabinet 100 can be located on a street or underground.

Figure 5:
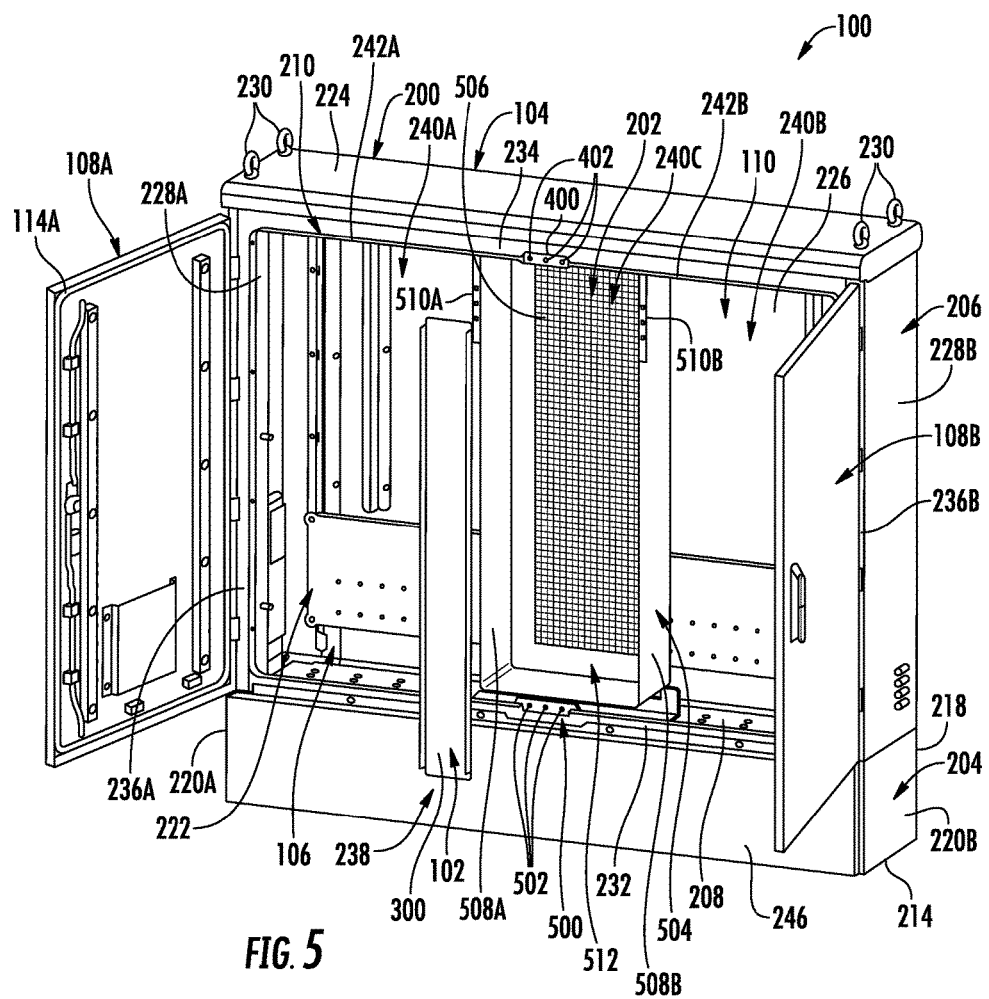
FIG. 5 is a perspective view of the equipment cabinet of FIGS. 1-2B further illustrating an interior of the equipment cabinet.

FIG. 5 is a perspective view of the equipment cabinet 100 of FIGS. 1-2B further illustrating the interior 110 of the equipment cabinet 100. As discussed above, the top rail 234 comprises a top recessed mounting panel 400. The bottom rail 232 also includes a bottom recessed mounting panel 500 with a plurality of through holes 502. The top recessed mounting panel 400 is positioned in the approximate middle of the top rail 234. However, in other embodiments, the top recessed mounting panel 400 is offset. Similarly, the bottom recessed mounting panel 500 is positioned in the approximate middle of the bottom rail 232. However, in other embodiments, the bottom recessed mounting panel 500 is offset. The bottom recessed mounting panel 500 and top recessed mounting panel 400 are positioned approximately across from one another (e.g., the same horizontal distance from a center, left side, and/or right side of the equipment cabinet housing 200. Accordingly, in the closed position, the movable center stile 102 is attached to and extends from and between the bottom recessed mounting panel 500 and the top recessed mounting panel 400, thereby bifurcating the front opening 106.

In certain embodiments, the mounting substructure 202 comprises a center mount frame 504 positioned in the approximate middle of the interior 110 of the equipment cabinet housing 200 for mounting fiber optic equipment 112 thereto. In particular, the center mount frame 504 comprises a rear wall 506, a left wall 508A forwardly extending from a left edge of the rear wall 506, a right wall 508B forwardly extending from a right edge of the rear wall 506, a left flange 510A outwardly extending from a center of the center mount frame 504 (e.g., towards the upper shell 206 left sidewall 228A), and a right flange 510B outwardly extending from a center of the center mount frame 504 (e.g., towards the upper shell 206 right sidewall 228B). Each of the rear wall 506, left and right walls 508A, 508B, and/or left and right flanges 510A, 510B may include one or more apertures (e.g., through holes, threaded holes, cage nut mounting holes, square holes, slots, etc.) for mounting fiber optic equipment 112. The rear wall 506, left wall 508A, and right wall 508B define a central mount area 512, which is a third area positioned between a first area (e.g., left area) accessible by the left door 108A and a second area (e.g., right area) accessible by the right door 108B. Here, the central mount area 512 is divided from the first and second areas by the left and right walls 508A, 508B. However, in certain embodiments, the first, second, and/or third areas are undivided and continuous.

Further, positioning the center mount frame 504 and movable center stile 102 in the center of the equipment cabinet 100 equally separates the two sides of the equipment cabinet 100 (e.g., providing an equal area of the left and right portions 240A, 240B of the front opening 106 and/or providing an equal volume of left and right portions of the interior 110). Thus, fiber optic equipment of equal sizes and/or widths can be mounted within the equipment cabinet 100. For example, the left and right sides could each mount 19 inch trays of fiber optic equipment 112. Additionally, equipment (e.g., fiber optic equipment 112) or mounts can be placed immediately behind the movable center stile 102 because the movable center stile 102 can be moved for access.

Accordingly, the movable center stile 102 and/or central mount area 512 can be configured (e.g., positioned and/or sized), such that the movable center stile 102 selectively encloses at least a portion (or the entirety) of the central mount area 512. In certain embodiments, positioning the movable center stile 102 in front of the central mount area 512 may act as a security feature. As mentioned above, and as further discussed below, each of the left and right doors 108A, 108B are independently operable, and also independently lockable. This allows different users (e.g., teams of users) access to different portions of the equipment cabinet 100. More specifically, a first user (e.g., team) could have a first key to unlock and open only the left door 108A to gain access to the left portion 240A of the front opening 106 and equipment mounted on the left side of the equipment cabinet 100. Similarly, a second user (e.g., team of users) could have a second key to unlock and open only the right door 108B to gain access to the right portion 240B of the front opening 106 and equipment mounted on the right side of the equipment cabinet 100. Thus, in some embodiments, in order to gain access to a middle portion 240C (e.g., central mount area 512) both teams with both sets of keys must be present in order to remove the movable center stile 102. Thus, in certain embodiments, the equipment cabinet 100 may provide three working spaces, where two of the three of those working spaces are approximately the same size.

Figure 6A:
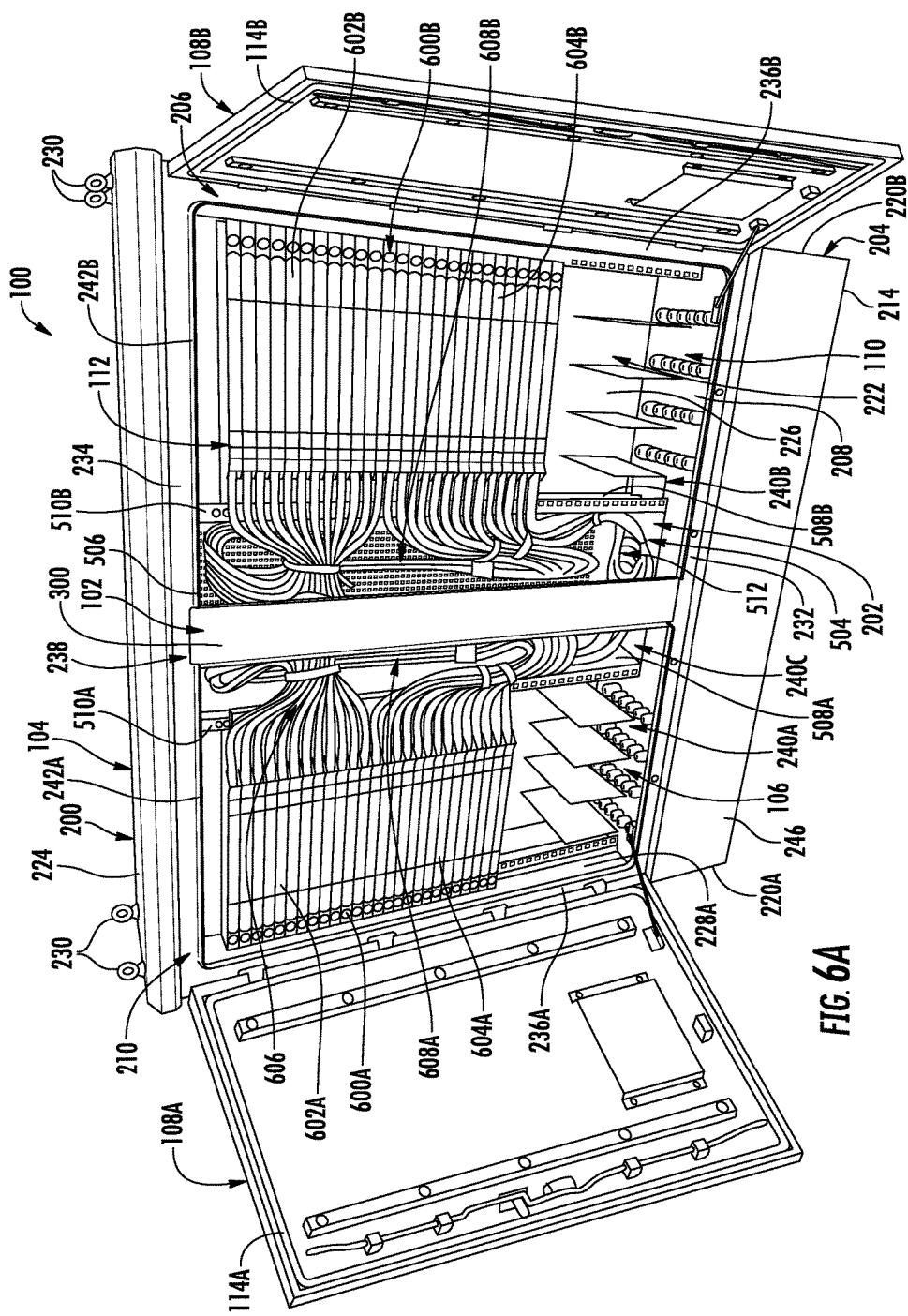
FIG. 6A is a front perspective view of the equipment cabinet of FIGS. 1-2B with the movable stile attached to the equipment cabinet in a closed position and including fiber optic equipment mounted within the equipment cabinet.
Figure 6B:
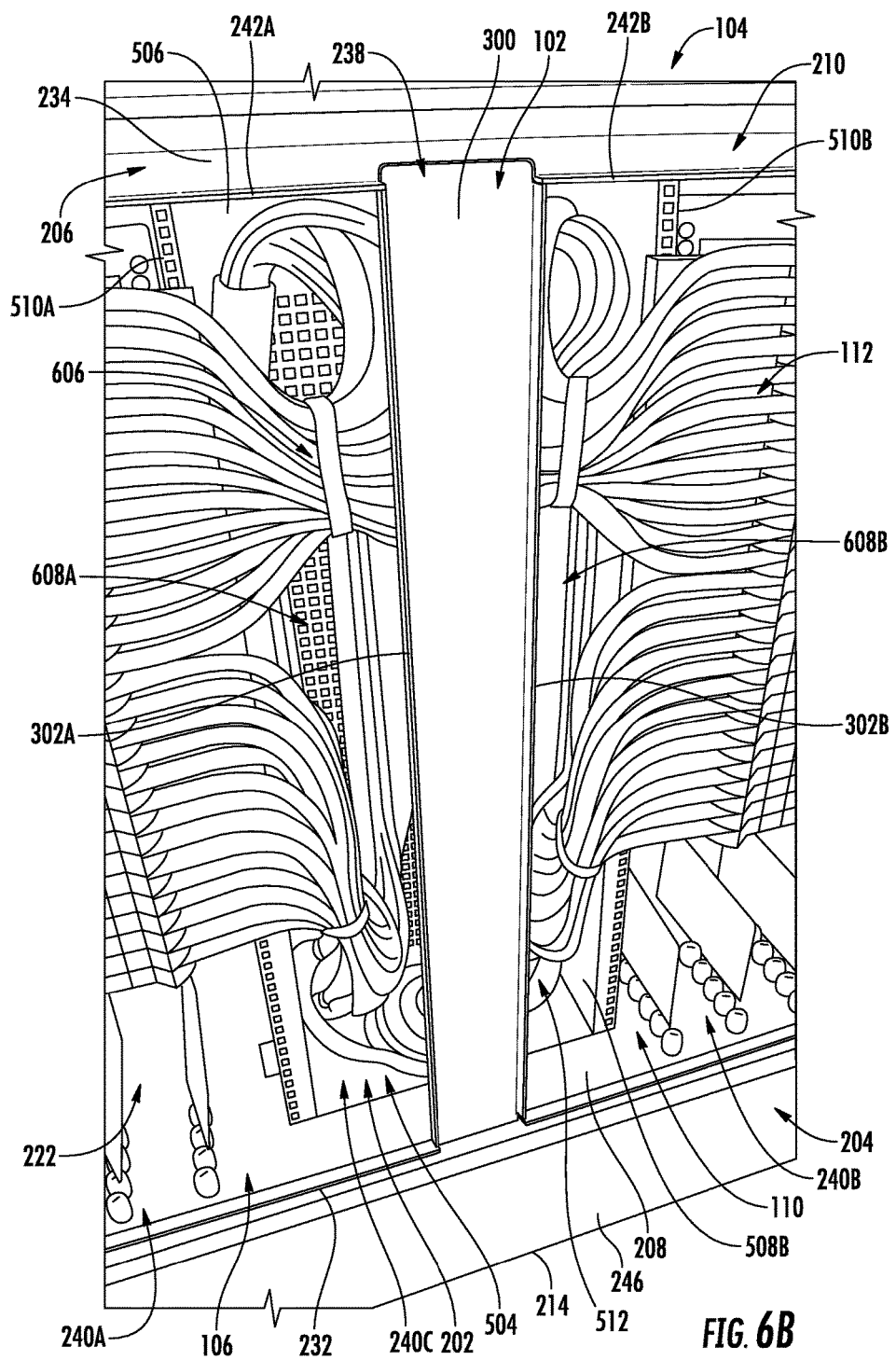
FIG. 6B is another front perspective view of the equipment cabinet of FIG. 6A with the movable stile in a closed position and with fiber optic equipment mounted within the equipment cabinet.

FIGS. 6A and 6B are views of the equipment cabinet 100 of FIGS. 1-2B with the movable center stile 102 in a closed position and with fiber optic equipment 112 mounted within the equipment cabinet 100. As shown, the center mount frame 504 of the mounting substructure 202 facilitates mounting of equipment (e.g., fiber optic equipment 112) within the housing 200. In particular, the left wall 508A and/or left flange 510A facilitate mounting of a first set of fiber optic equipment modules 600A (e.g., fiber optic drawers, fiber optic trays, etc.) including a left top set 602A and a left bottom set 604A. The right wall 508B and/or right flange 510B facilitate mounting of a second set of fiber optic equipment modules 600B (e.g., fiber optic drawers, fiber optic trays, etc.) including a right top set 602B and a right bottom set 604B. The left top set 602A, left bottom set 604A, right top set 602B, and/or right bottom set 604B could be the same type of fiber optic equipment and/or have similar volumes and/or widths. For example, the left top set 602A, left bottom set 604A, right top set 602B, and/or right bottom set 604B may each comprise a 19 inch tray. The left top set 602A, left bottom set 604A, right top set 602B, and/or right bottom set 604B are connected to each other by wires 606 and connections, at least some of which may be positioned in the central mount area 512. Accordingly, in some embodiments, to access these wires 606 and/or connections both the left and right doors 108A, 108B must be unlocked and opened to remove the movable center stile 102 to access the central mount area 512.

In some embodiments, as shown in FIGS. 6A and 6B, there is a left gap 608A between the left edge (e.g., left flange 302A) of the movable center stile 102 and the left wall 508A of the center mount frame 504 such that opening the left door 108A provides a user with sufficient clearance to run wires 606 from the left top set 602A and/or left bottom set 604A to the central mount area 512. Additionally, or alternatively, the left gap 608A may be wide enough to allow a user to access the left side of the central mount area 512 for installing and/or maintaining wires 606 or connections in the central mount area 512 for the first set of fiber optic equipment modules 600A. For example, in one embodiment, the left top set 602A is connected by wires 606 to the left bottom set 604A with the associated wires 606 placed within the central mount area 512, all of which is accessible when the left door 108A is open, but only when the left door is open 108A (e.g., not accessible from the right side).

Similarly, in some embodiments, as shown in FIGS. 6A and 6B, there is a right gap 608B between the right edge (e.g., right flange 302B) of the movable center stile 102 and the right wall 508B of the center mount frame 504 such that opening the right door 108B provides a user with sufficient clearance to run wires 606 from the right top set 602B and/or right bottom set 604B to the central mount area 512. Additionally, or alternatively, the right gap 608B may be wide enough to allow a user to access the left side of the central mount area 512 for installing and/or maintaining wires 606 or connections in the central mount area 512 for the second set of fiber optic equipment modules 600B. For example, in one embodiment, the right top set 602B is connected by wires 606 to the right bottom set 604B with the associated wires 606 placed within the central mount area 512, all of which is accessible when the right door 108B is open, but only when the right door is open 108B (e.g., not accessible from the left side).

Further, the left flange 302A of the movable center stile 102 aligns with the ends of the left peripheral flange 242A, and the right flange 302B of the movable center stile 102 aligns with the ends of the right peripheral flange 242B, thereby forming a seamless flange encircling the left and right portions 240A, 240B of the front opening 106.

Figure 7A:
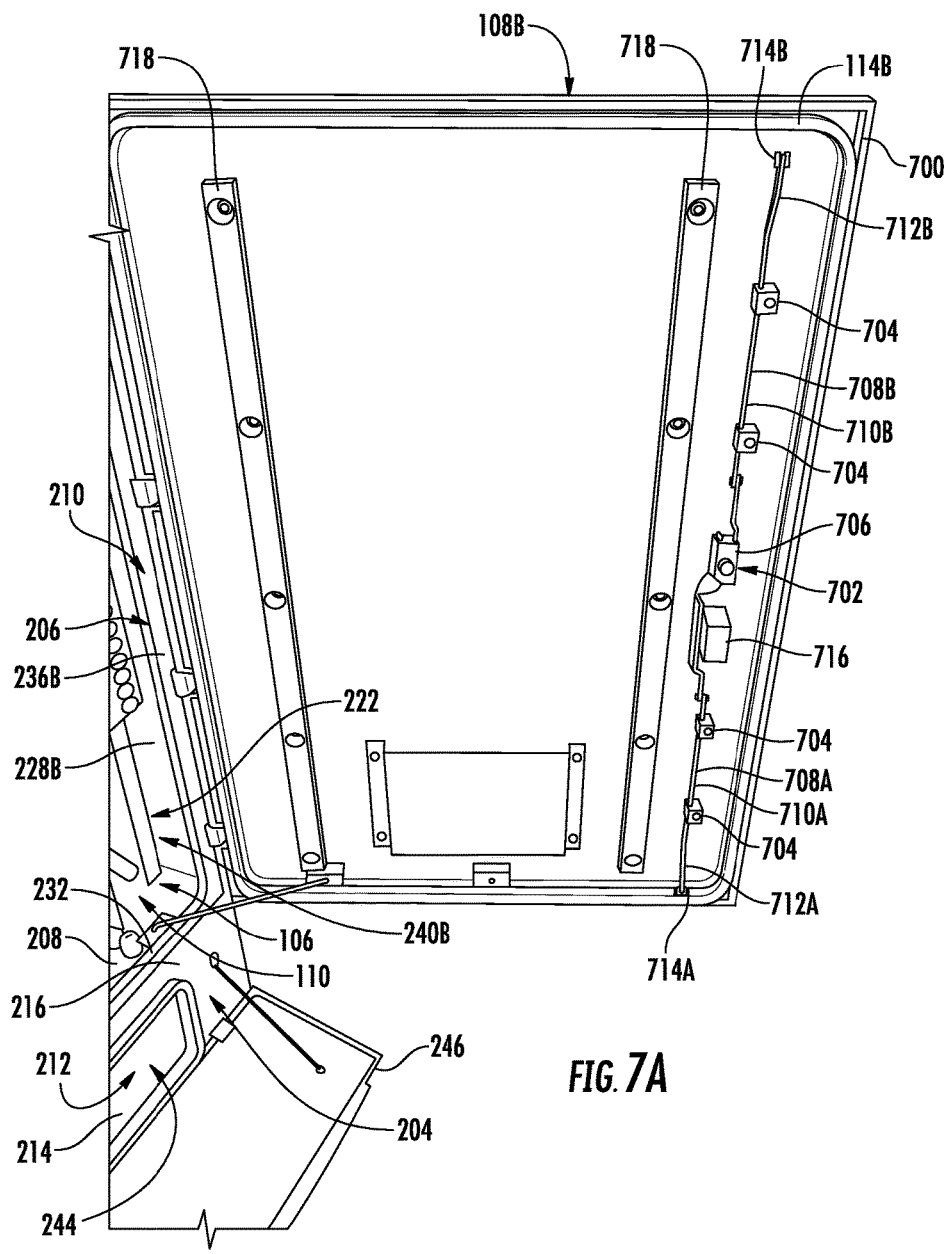
FIG. 7A is a perspective view of an interior of a door of the equipment cabinet of FIGS. 1-2B and 5.
Figure 7B:
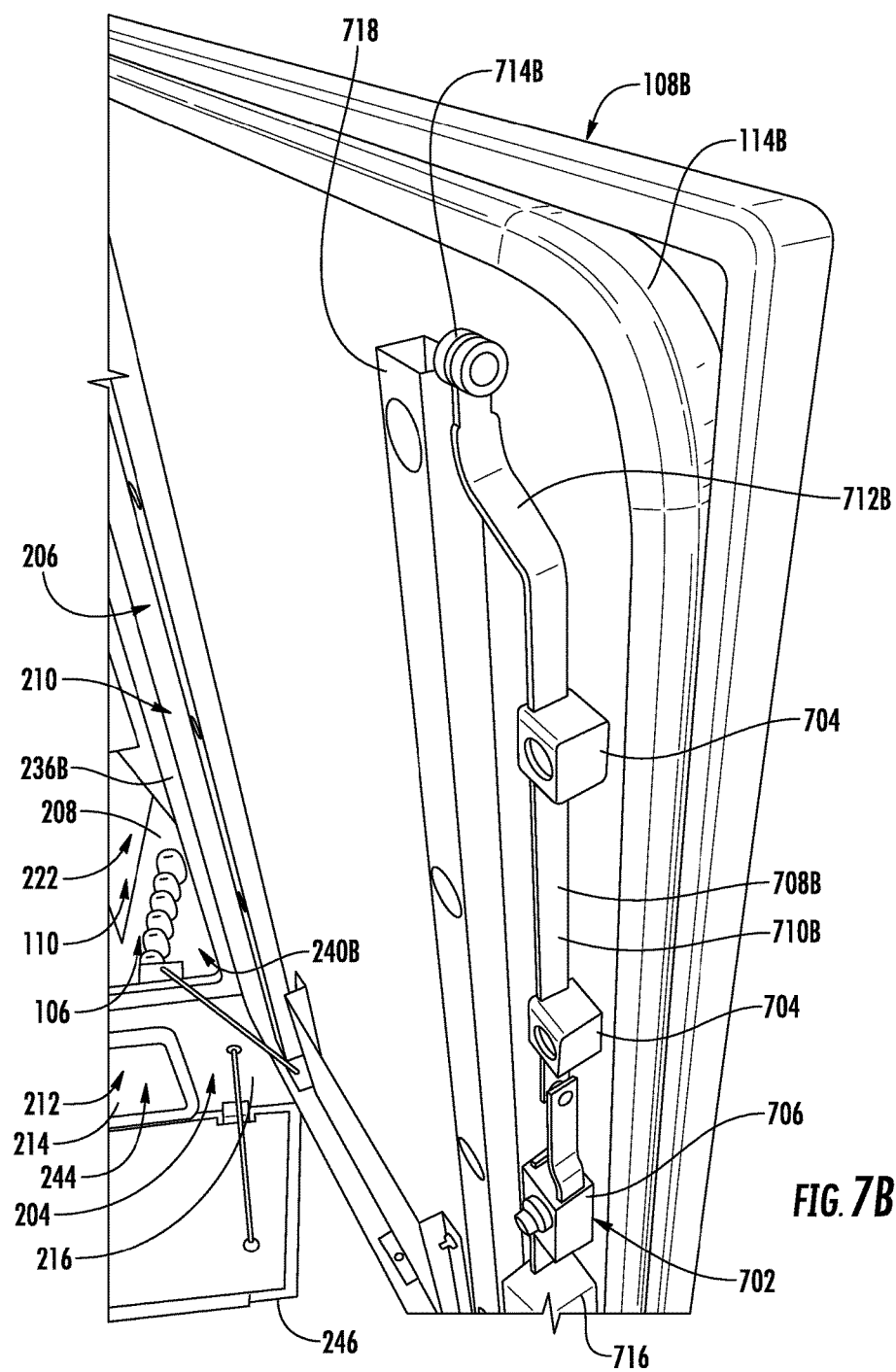
FIG. 7B is an enlarged perspective view of the interior of the door of FIG. 7A further illustrating a gasket fixedly attached to the interior of the door.

FIGS. 7A and 7B are views of an interior of the right door 108B of the equipment cabinet 100 of FIGS. 1-2B and 5. Although the discussion is directed to the right door 108B, the discussion is just as applicable to the left door 108A. As shown, the right door 108B includes a peripheral flange 700 extending from an inner surface of the right door 108B (e.g., for structural rigidity), and a right sealing gasket 114B fixedly attached on an interior surface of the right door 108B around a peripheral edge thereof. The right sealing gasket 114B forms an environmental seal between the right door 108B and the housing 200 (not shown in FIGS. 7A and 7B). The right sealing gasket 114B is fixedly attached to the right door 108B (e.g., within the peripheral flange 700) because if it was fixedly attached to the housing 200, the right sealing gasket 114B would have to be removed from the housing 200 to move the movable center stile 102 (not shown in FIGS. 7A and 7B) to an open position. In other words, attaching the right sealing gasket 114B to the housing 200 would require attachment to the movable center stile 102.

The right door 108B further includes a locking mechanism 702 to selectively lock and unlock the right door 108B to the housing 200 and one or more supports 704 to secure the locking mechanism 702 to an interior surface of the right door 108B. In particular, the locking mechanism 702 includes a rotation mechanism 706 positioned in an approximate vertical center of the right door 108B towards a center of the equipment cabinet housing 200 (opposite from the door hinge) to rotate along with a key (or other unlocking mechanism) when operated by a user. The right door 108B further includes a bottom locking arm 708A in mechanical communication with and extending downwardly from the rotation mechanism 706 and a top locking arm 708B in mechanical communication and extending upwardly from the rotation mechanism 706. In this way, rotation of the rotation mechanism 706 drives the bottom locking arm 708A and top locking arm 708B outward or inward to lock or unlock the right door 108B from the housing 200.

In particular, the bottom locking arm 708A includes a straight portion 710A extending downward from the rotation mechanism 706, and an angled portion 712A extending downward from (and integrally connected to) the straight portion 710A. The angled portion 712A is angled away from the interior surface of the right door 108B to provide clearance for an end of the angled portion 712A to extend past the right sealing gasket 114B and peripheral flange 700 as it moves downwardly to lock the right door 108B. An end of the angled portion 712A, opposite from the rotation mechanism 706, includes a roller 714A to facilitate movement of the angled portion 712A and engagement of the angled portion 712A with the housing 200. In particular, when the bottom locking arm 708A is in an unlocked position, the bottom locking arm 708A is positioned inward and clears the bottom rail 232 of the face frame 210. Once the right door 108B is in a closed position, the bottom locking arm 708A is movable to a locked position, wherein the roller 714A of the angled portion 712A translates past the bottom rail 232 of the cabinet face frame 210 to engage an inner surface of the bottom rail 232, such that the bottom rail 232 is positioned between the bottom locking arm 708A and the inner surface of the right door 108B, thereby locking the right door 108B to the housing 200.

Similarly, the top locking arm 708B includes a straight portion 710B extending upward from the rotation mechanism 706, and an angled portion 712B extending upward from (and integrally connected to) the straight portion 710B. The angled portion 712B is angled away from the interior surface of the right door 108B to provide clearance for an end of the angled portion 712B to extend past the right sealing gasket 114B and peripheral flange 700 as it moves upwardly to lock the right door 108B. An end of the angled portion 712B, opposite from the rotation mechanism 706, includes a roller 714B to facilitate movement of the angled portion 712B and engagement of the angled portion 712B with the housing 200. In particular, when the top locking arm 708B is in an unlocked position, the top locking arm 708B is positioned inward and clears the top rail 234 of the face frame 210. Once the right door 108B is in a closed position, the top locking arm 708B is movable to a locked position, wherein the roller 714B of the angled portion 712B translates past the top rail 234 of the cabinet face frame 210 to engage an inner surface of the top rail 234, such that the top rail 234 is positioned between the top locking arm 708B and the inner surface of the right door 108B, thereby locking the right door 108B to the housing 200.

The locking mechanism 702 could include a side engagement finger 716 (e.g., prong, nub, etc.) to engage (e.g., frictionally engage) a peripheral edge of the movable center stile 102. The side engagement finger 716 may be static or movable (e.g., translatable). Thus, the three points of engagement of the locking mechanism 702 by the bottom locking arm 708A, the top locking arm 708B, and the side engagement finger 716 facilitate a tight seal between the left and right doors 108A, 108B and the housing 200 to provide increased sealing performance (e.g., IP 65, IP 68, etc.).

It is noted that fewer or more locking mechanisms could be used. Further, the right door 108B could include one or more stiffening bars 718 to add structural rigidity to the right door 108B.

Figure 8:
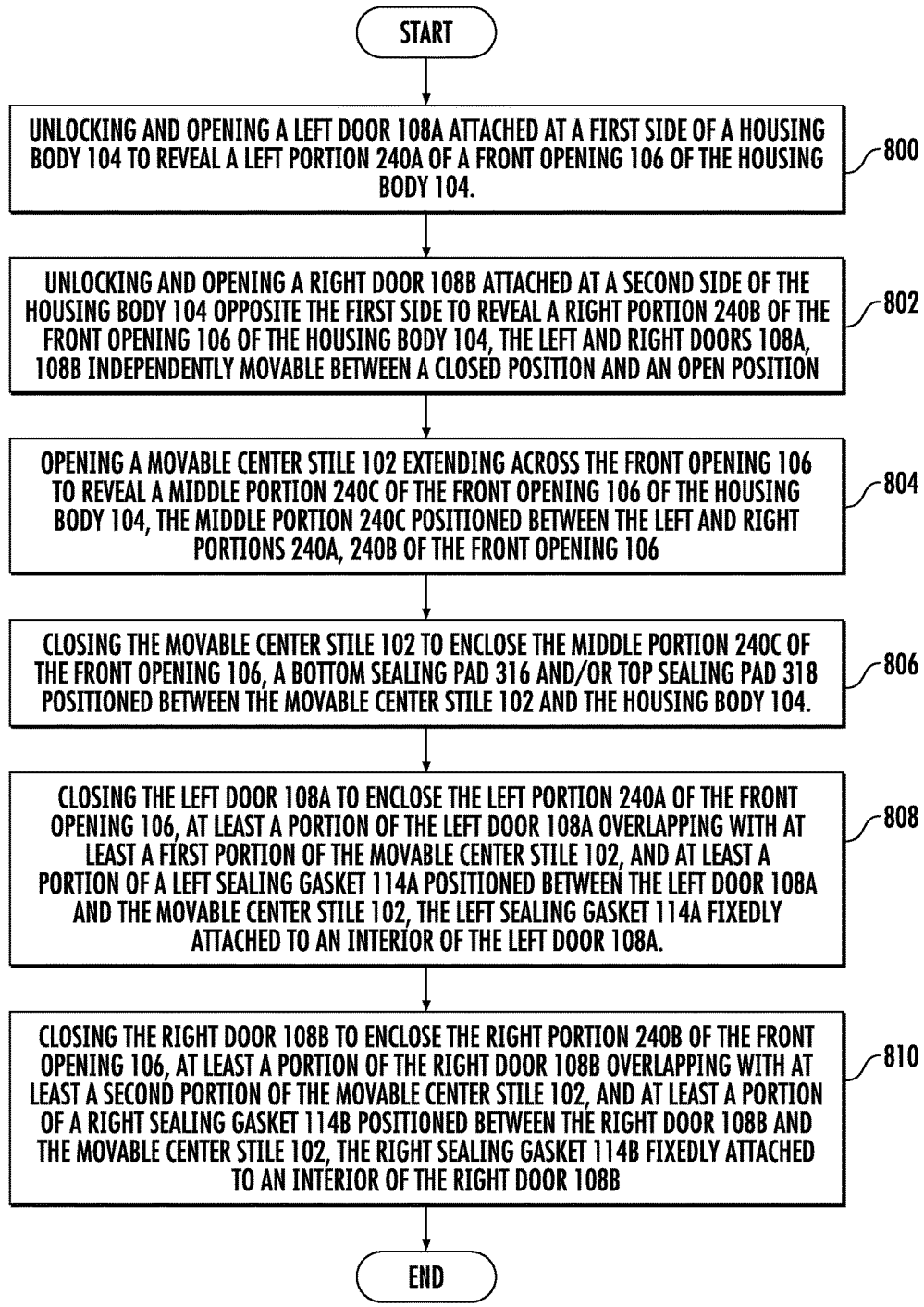
FIG. 8 is a flowchart illustrating an exemplary process of using the equipment cabinet of FIGS. 1-2B and 5-7B.

FIG. 8 is a flowchart illustrating an exemplary process of using the equipment cabinet 100 of FIGS. 1-2B and 5-7B. Step 800 includes unlocking and opening a left door 108A (e.g., first door) attached to a first side of a housing body 104 to reveal a left portion 240A (e.g., first portion) of a front opening 106 of the housing body 104. Step 802 includes unlocking and opening a right door 108B (e.g., second door) attached to a second side of the housing body 104 opposite the first side to reveal a right portion 240B (e.g., second portion) of the front opening 106 of the housing body 104, the left and right doors 108A, 108B each independently movable between a closed position and an open position. Step 804 includes opening a movable center stile 102 extending across the front opening 106 to reveal a middle portion 240C (e.g., third portion) of the front opening 106 of the housing body 104, the middle portion 240C positioned between the left and right portions 240A, 240B of the front opening 106. Step 806 includes closing the movable center stile 102 to enclose the middle portion 240C of the front opening 106, a bottom sealing pad 316 and/or top sealing pad 318 (e.g., first and/or second sealing pad) positioned between the movable center stile 102 and the housing body 104. Step 808 includes closing the left door 108A to enclose the left portion 240A of the front opening 106, at least a portion of the left door 108A overlapping with at least a first portion of the movable center stile 102, and at least a portion of a left sealing gasket 114A (e.g., first sealing gasket) positioned between the left door 108A and the movable center stile 102, the left sealing gasket 114A fixedly attached to an interior of the left door 108A. Step 810 includes closing the second door (e.g., right door 108B) to enclose the second portion (e.g., right portion 240B) of the front opening 106, at least a portion of the second door (e.g., right door 108B) overlapping with at least a second portion of the movable center stile 102, and at least a portion of a right sealing gasket 114B (e.g., second sealing gasket) positioned between the right door 108B and the movable center stile 102, the right sealing gasket 114B fixedly attached to an interior of the right door 108B.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An equipment cabinet, comprising:
    a housing body defining a front opening and comprising a top rail and a bottom rail;
    a first door attached to a first side of the housing body, the first door movable to selectively enclose a first portion of the front opening, the first door comprising a first sealing gasket on an interior of the first door;
    a second door attached to a second side of the housing body opposite the first side, the second door movable to selectively enclose a second portion of the front opening, the second door comprising a second sealing gasket on an interior of the second door, the first and second doors each independently movable between a closed position and an open position;
    a vertical stile movably attached to the housing body at the top rail and the bottom rail to selectively enclose a third portion of the front opening between the first and second portions of the front opening, at least a portion of the first door overlapping with at least a first portion of the stile such that at least a portion of the first sealing gasket is positioned between the stile and the first door when the first door is in the closed position, and at least a portion of the second door overlapping with at least a second portion of the stile such that at least a portion of the second sealing gasket is positioned between the stile and the second door when the second door is in the closed position;
    a first sealing pad positioned between the stile and the top rail of the housing body when the stile encloses the third portion, the first sealing pad comprising a first sealing pad aperture for receiving a first fastener to removably attach the stile to the housing body; and
    a second sealing pad positioned between the stile and the bottom rail of the housing body when the stile encloses the third portion, the second sealing pad comprising a second sealing pad aperture for receiving a second fastener to removably attach the stile to the housing body.

2. The equipment cabinet of claim 1, wherein the first sealing pad provides an Ingress Protection (IP) rating of IP 65.

3. The equipment cabinet of claim 2, wherein the stile further comprises at least one blind hole in a back surface thereof and a fastener frictionally engaged with the at least one blind hole for removable attachment of the stile from the housing body.

4. The equipment cabinet of claim 1, wherein the housing body further comprises a first area, a second area, and a third area located between the first area and the second area, and wherein the third area is only accessible when the stile encloses the third portion.

5. The equipment cabinet of claim 4, wherein the first, second, and third areas are undivided.

6. The equipment cabinet of claim 1, wherein the first and second doors are independently lockable.

7. The equipment cabinet of claim 1, further comprising fiber optic equipment mounted in the housing body.

8. The equipment cabinet of claim 1, wherein the stile further comprises a stiffening bar.

9. The equipment cabinet of claim 1, wherein the top rail of the housing body comprises a first recessed mounting panel for receiving the first sealing pad and a first portion of the stile and the bottom rail of the housing body comprises a second recessed mounting panel for receiving the second sealing pad and a second portion of the stile.

10. The equipment cabinet of claim 9, wherein the first and second recessed mounting panels are sized such that the stile is approximately flush with a front surface of the top rail and a front surface of the bottom rail when the stile is removably attached to the housing body.

11. An equipment cabinet, comprising:
    a housing body defining a front opening and comprising a top rail and a bottom rail;

a first door attached to a first side of the housing body, the first door movable to selectively enclose a first portion of the front opening, the first door comprising a first sealing gasket on an interior of the first door;

a second door attached to a second side of the housing body opposite the first side, the second door movable to selectively enclose a second portion of the front opening, the second door comprising a second sealing gasket on an interior of the second door, the first and second doors each independently movable between a closed position and an open position;

a vertical stile movably attached to the housing body at the top rail and the bottom rail to selectively enclose a third portion of the front opening between the first and second portions of the front opening, at least a portion of the first door overlapping with at least a first portion of the stile such that at least a portion of the first sealing casket is positioned between the stile and the first door when the first door is in the closed position, and at least a portion of the second door overlapping with at least a second portion of the stile such that at least a portion of the second sealing gasket is positioned between the stile and the second door when the second door is in the closed position;

the first sealing gasket fixedly attached to the interior of the first door, at least a portion of the first sealing gasket positioned between the first door and the stile when the first door is in the closed position;

the second sealing gasket fixedly attached to the interior of the second door, at least a portion of the second sealing gasket positioned between the second door and the stile when the second door is in the closed position;

a first sealing pad positioned between the stile and the top rail of the housing body when the stile encloses the third portion, the first sealing pad comprising a first sealing pad aperture for receiving a first fastener to removably attach the stile to the housing body; and a second sealing pad positioned between the stile and the bottom rail of the housing body when the stile encloses the third portion, the second sealing pad comprising a second sealing pad aperture for receiving a second fastener to removably attach the stile to the housing body.

12. The equipment cabinet of claim 11, wherein the first and second sealing gaskets provide an Ingress Protection (IP) rating of IP 65.

13. The equipment cabinet of claim 11, wherein the stile is removable from the housing body.

14. The equipment cabinet of claim 13, wherein the stile further comprises at least one blind hole in a back surface thereof and a fastener frictionally engaged with the at least one blind hole for removable attachment of the stile from the housing body.

15. The equipment cabinet of claim 11, wherein the housing body further comprises a first area, a second area, and a third area located between the first area and the second area, and wherein the third area is only accessible when the stile encloses the third portion.

16. The equipment cabinet of claim 15, wherein the first, second, and third areas are undivided.

17. The equipment cabinet of claim 11, wherein the first and second doors are independently lockable.

18. The equipment cabinet of claim 11, further comprising fiber optic equipment mounted in the housing body.

19. A method of using an equipment cabinet, comprising:
opening a first door attached to a first side of a housing body to reveal a first portion of a front opening of the housing body, wherein the first door comprises a first sealing gasket on an interior of the first door and wherein the housing body comprises a top rail and a bottom rail;

opening a second door attached to a second side of the housing body opposite the first side to reveal a second portion of the front opening of the housing body, wherein the second door comprises a second sealing gasket on an interior of the second door, the first and second doors each independently movable between a closed position and an open position;

opening a vertical stile extending across the front opening from the top rail to the bottom rail to reveal a third portion of the front opening of the housing body, the third portion positioned between the first and second portions of the front opening;

closing the stile to enclose the third portion of the front opening, a first sealing pad positioned between the stile and the top rail of the housing body and a second sealing pad positioned between the stile and the bottom rail of the housing body when the stile is closed;

securing a first fastener through a first sealing pad aperture in the first sealing pad to removably attach the stile to the housing body;

securing a second fastener through a second sealing pad aperture in the second sealing pad to removably attach the stile to the housing body;

closing the first door to enclose the first portion of the front opening, at least a portion of the first door overlapping with at least a first portion of the stile such that at least a portion of the first sealing gasket is positioned between the stile and the first door; and closing the second door to enclose the second portion of the front opening, at least a portion of the second door overlapping with at least a second portion of the stile such that at least a portion of the second sealing gasket is positioned between the stile and the second door.

20. The method of claim 19, further comprising:
unlocking the first door; and
unlocking the second door, the first and second doors independently lockable from each other.

21. A method of using an equipment cabinet, comprising:
opening a first door attached to a first side of a housing body to reveal a first portion of a front opening of the housing body, wherein the first door comprises a first sealing gasket on an interior of the first door and wherein the housing body comprises a top rail and a bottom rail;

opening a second door attached to a second side of the housing body opposite the first side to reveal a second portion of the front opening of the housing body, wherein the second door comprises a second sealing gasket on an interior of the second door, the first and second doors each independently movable between a closed position and an open position;

opening a vertical stile extending across the front opening from the top rail to the bottom rail to reveal a third portion of the front opening of the housing body, the third portion positioned between the first and second portions of the front opening;

closing the stile to enclose the third portion of the front opening, a first sealing pad positioned between the stile and the top rail of the housing body and a second sealing pad positioned between the stile and the bottom rail of the housing body when the stile is closed;

securing a first fastener through a first sealing pad aperture in the first sealing pad to removably attach the stile to the housing body;

securing a second fastener through a second sealing pad aperture in the second sealing pad to removably attach the stile to the housing body;

closing the first door to enclose the first portion of the front opening, at least a portion of the first door overlapping with at least a first portion of the stile, and at least a portion of the first sealing gasket positioned between the first door and the stile, the first sealing gasket fixedly attached to an interior of the first door; and closing the second door to enclose the second portion of the front opening, at least a portion of the second door overlapping with at least a second portion of the stile, and at least a portion of the second sealing gasket positioned between the second door and the stile, the second sealing gasket fixedly attached to an interior of the second door.

22. The method of claim 21, further comprising:

unlocking the first door; and unlocking the second door, the first and second doors independently lockable from each other.

* * * * *

UNITED STATES PATENT AND TRADEMARK OFFICE
CERTIFICATE OF CORRECTION

PATENT NO. : 9,946,044 B1
APPLICATION NO. : 15/421887
DATED : April 17, 2018
INVENTOR(S) : Grzegorz Konrad Gralewski-Sek et al.

Page 1 of 1

It is certified that error appears in the above-identified patent and that said Letters Patent is hereby corrected as shown below:

In the Claims

In Column 17, Line 18, Claim 11, delete "casket" and insert -- gasket --, therefor.

Signed and Sealed this
Twenty-fourth Day of March, 2020

Andrei Iancu
*Director of the United States Patent and Trademark Office*